United States Patent [19]

Heutmaker et al.

[11] Patent Number: 5,481,186

[45] Date of Patent: Jan. 2, 1996

[54] METHOD AND APPARATUS FOR INTEGRATED TESTING OF A SYSTEM CONTAINING DIGITAL AND RADIO FREQUENCY CIRCUITS

[75] Inventors: Michael S. Heutmaker, Trenton; Madhuri Jarwala, Lawrenceville, both of N.J.; Duy K. Le, Levittown, Pa.

[73] Assignee: AT&T Corp., Murray Hill, N.J.

[21] Appl. No.: 317,070

[22] Filed: Oct. 3, 1994

[51] Int. Cl.$^6$ .................................................. G01R 35/00
[52] U.S. Cl. ...................... 324/158.1; 455/67.1; 455/67.4; 455/115; 371/20.5
[58] Field of Search .................. 324/158.1; 455/67.1, 455/67.4, 115, 126; 375/224; 371/20.5

[56] References Cited

U.S. PATENT DOCUMENTS

| | | | |
|---|---|---|---|
| 5,029,166 | 7/1991 | Jarwala et al. | 371/22.1 |
| 5,337,316 | 8/1994 | Weiss et al. | 371/20.5 |

Primary Examiner—Kenneth A. Wieder
Assistant Examiner—Kourosh Cyrus Khosravi
Attorney, Agent, or Firm—Robert B. Levy

[57] ABSTRACT

A method is provided for accomplishing unified testing of a digital/RF system (10'), comprised of a digital controller (14), a base-band processor (20), an RF transmitter (24) and an RF receiver (34). The digital portion of the digital/RF system (10'), including the digital controller (14) and the base-band processor (20), is tested by a digital test technique such as Boundary-Scan testing. Test patterns for the RF elements are down-loaded from the digital controller (14) to the base-band processor via a Boundary-Scan Test Access Port (TAP). Thereafter, the RF transmitter (24) and the RF receiver (34) are tested by applying the test patterns from the base-band processor to the RF transmitter for transmission thereby. The signal produced by the RF transmitter (24) in response to the applied test pattern is converted to a first digital signal stream for processing by the base-band processor (20) to determine the operability of the transmitter. The signal produced by the RF transmitter (24) is also received by the RF receiver (34) for demodulation thereby. The demodulated receiver signal is then converted to a second signal stream for input to the base-band processor to determine the operability of the receiver.

8 Claims, 2 Drawing Sheets

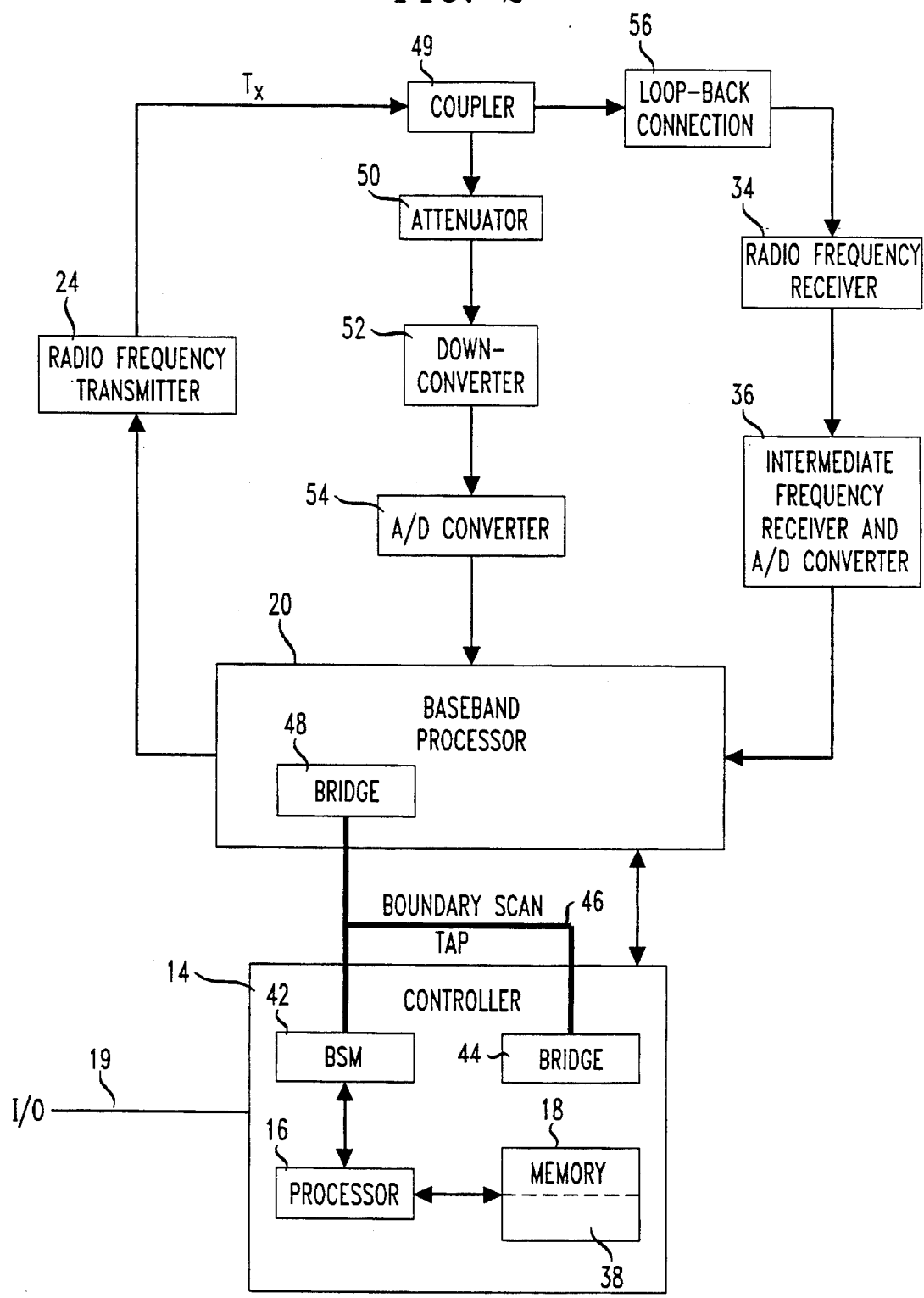

5,481,186

1

METHOD AND APPARATUS FOR INTEGRATED TESTING OF A SYSTEM CONTAINING DIGITAL AND RADIO FREQUENCY CIRCUITS

TECHNICAL FIELD

This invention relates to a method and apparatus for integrated testing of an electronic system, such as a digitally-controlled Radio-Frequency (RF) transceiver, containing both digital and RF circuits.

BACKGROUND ART

Wireless telecommunications networks utilize systems, typically in the form of digitally-controlled RF transceivers, that contain both digital and RF circuits. Such systems, hereinafter referred to as a "digital/RF systems", operate to transmit information to, and receive information from, other such digital/RF systems. A typical digital RF system comprises a digital controller for controlling the system and a base-band processor (typically, a digital signal processor) for processing incoming voice and/or data signals, such as those received from a land-based network, to prepare such signals for transmission by an RF transmitter within the system. The base-band processor also serves to process signals received via an analog RF receiver within the system.

During the manufacture of digital/RF systems, as well as during their routine maintenance, the systems are tested to assure their operability. Traditionally, the digital controller and the base-band processor of each digital/RF system have been tested separately from the RF transmitter and receiver. Digital test techniques, such as Boundary-Scan testing, can be used for structurally testing the digital controller and the base-band processor. However, such digital test techniques are not suitable for testing the RF transmitter and RF receiver.

Rather, the RF transmitter and RF receiver are tested by measuring their functional response to applied stimuli. In practice, the applied stimuli may be dissimilar to the actual signals present in the transmitter and receiver during normal operation. Thus, the results achieved during testing may not represent the true operating state of the transmitter and receiver. Moreover, specialized instrumentation often must be used to measure the functionality of the RF transmitter and RF receiver, making such testing costly to carry out.

Thus, there is a need for an integrated test technique for testing both the digital and RF elements within a digital/RF system.

BRIEF SUMMARY OF THE INVENTION

Briefly, in accordance with a preferred embodiment of the invention, a technique is provided for accomplishing integrated testing of a digital RF system comprised of a digital controller, a base-band processor (typically in the form of one or more digital signal processors), an RF transmitter and an RF receiver. In accordance with the invention, the digital/RF system is tested in several stages. First, the digital controller and base-band processor are structurally tested by a digital test technique such as the Boundary-Scan test technique. (To carry out Boundary, Scan testing, it is necessary for both the digital controller and the base-band processor to have a Boundary-Scan architecture.) Once the digital portion of the digital/RF system has been tested, the RF portion of the system is tested. To accomplish testing of the RF elements (i.e., the transmitter and receiver), test stimuli, comprising different test patterns, are down-loaded from the digital controller to the base-band processor. Typically, the test patterns are down-loaded via a Boundary-Scan Test Access Port (TAP) associated with the base-band processor. (During structural testing of the base-band processor, the Boundary-Scan TAP of the base-band processor serves as the gateway by which test signals are communicated from the digital controller to carry out Boundary-Scan testing.) During RF testing, the TAP of the base-band processor is used as the gateway by which stimuli are communicated to the RF transmitter. To test the RF transmitter, the base-band processor down-loads at least one test pattern to the RF transmitter which, in turn, produces a corresponding RF signal. The RF signal is then converted to a first digital signal stream that is processed by the base-band processor to verify the operation of the transmitter. The RF signal produced by the transmitter is also coupled to the RF receiver, which, in turn, generates an analog signal that is then converted into a second digital signal stream. The second digital signal stream is processed by the base-band processor to verify the operability of the receiver.

As may be appreciated, the above-described test technique accomplishes testing of both the digital and RF elements of a digital/RF system in an integrated manner without the need for specialized instrumentation.

BRIEF DESCRIPTION OF THE DRAWINGS

FIG. 2 is a block schematic diagram of the digital RF system of FIG. 1, as modified in accordance with the present invention, to facilitate integrated testing of both the digital and RF portions of the system.

DETAILED DESCRIPTION

Figure 1:
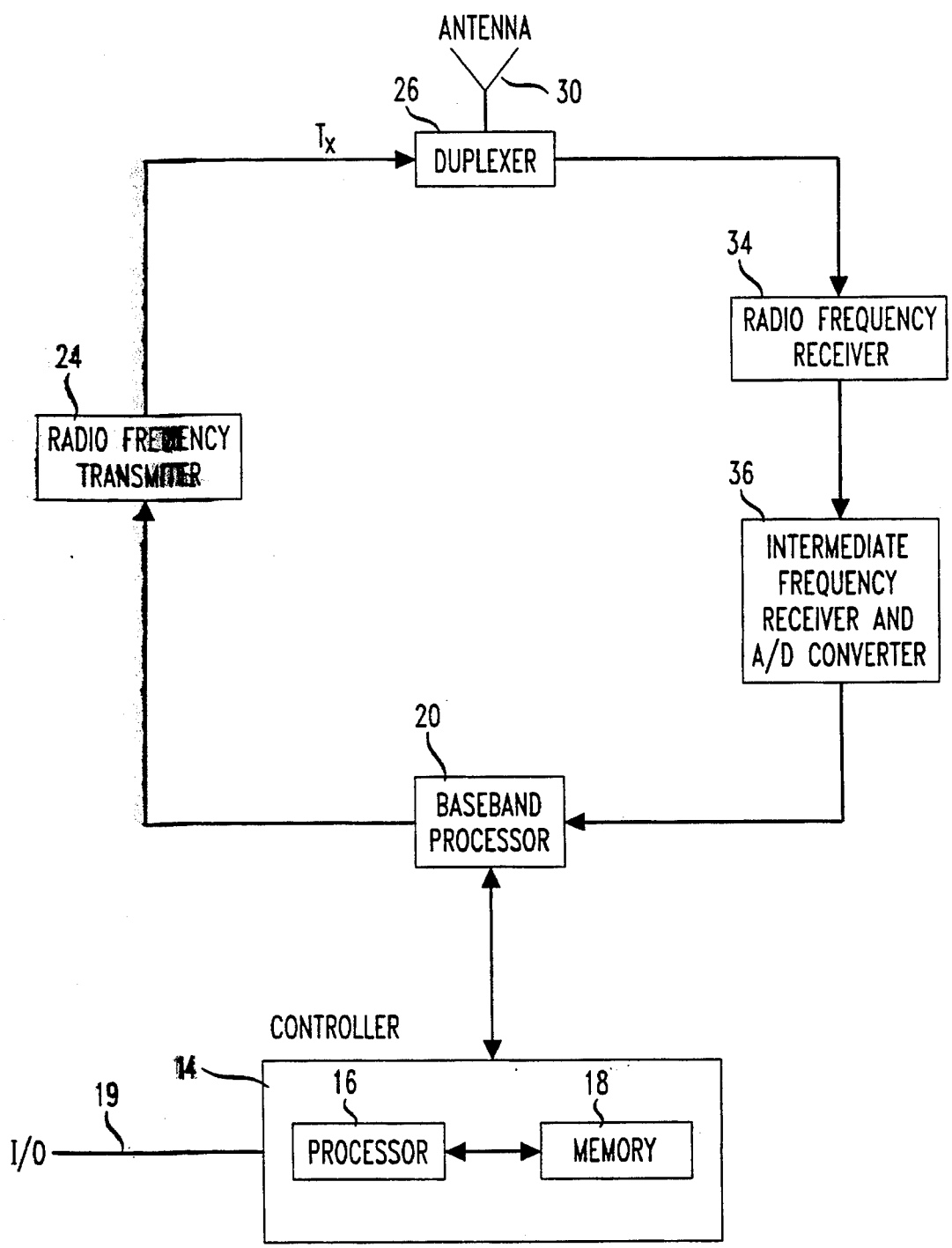
FIG. 1 is a block schematic diagram of a digital RF system according to the prior art.

FIG. 1 illustrates a prior-art digital/RF system 10. The RF system 10 operates to convert digitized voice and/or data, as may be supplied from a land-based network (not shown), into an RF signal for transmission to a wireless terminal (not shown). The system 10 also operates to receive RF signals and to convert such signals into digitized voice and/or data signals for transmission back to the land-based network.

The digital/RF system 10 comprises a controller 14, including a microprocessor 16 and associated memory 18, for controlling the system and for communicating information along an I/O line 19. In particular, the controller 14 controls the operation of a base-band processor 20 (e.g., a digital signal processor or group of such processors) that functions to process incoming voice and/or data signals (hereinafter referred to as "forward signals") that are supplied to the controller from the land-based network. In practice, the base-band processor 20 processes the forward signals in the manner described in U.S. Pat. No. 5,001,742, issued on Mar. 19, 1991, in the name of Robert C. Wang, and assigned to AT&T Bell Laboratories (hereinafter incorporated by reference).

The base-band processor 20 supplies the now-processed forward signals to an RF transmitter 24 that is controlled by the controller 14. The transmitter 24 modulates the processed forward signals from the base-band processor 20 on a reference carder signal to generate an RF signal depicted by the legend Tx. The RF signal Tx is supplied to a duplexer 26 that separates the transmit and receive signal paths.

The duplexer 26 couples received signals from the antenna 30 to an RF receiver 34. The receiver 34 demodulates the RF signals from the antenna to yield an Intermediate Frequency (IF) signal. A combined IF receiver and A/D converter 36 converts the IF signal from the receiver 34 into a base-band signal (hereinafter referred to as a "reverse" signal) that is supplied to the base-band processor 20 for processing. The base-band processor 20 processes the reverse signal from the combined IF receiver and A/D converter 36 typically in the manner described in the aforementioned Wang U.S. Pat. No. 5,001,742.

In the past, the digital elements (i.e., the controller 14 and the base-band processor 20) were tested separately from the RF elements (the transmitter 24, the receiver 34, and the IF receiver and A/D converter 36). Such separate testing has proven inconvenient. To overcome this difficulty, an improved digital/RF system 10', shown in FIG. 2, has been developed to facilitate unified testing. The RF test system 10' of FIG. 2 includes elements in common wish the test system 10 of FIG. 1, and, therefore, like reference numbers have been employed in FIG. 2 to describe like elements. (Although not shown in FIG. 2, the digital/RF system also includes the duplexer 26 and antenna 30 of FIG. 1.)

The controller 14 of the digital RF system 10' of FIG. 2, like the controller 14 of FIG. 1, includes a memory 18 that stores control commands. However, unlike the memory 18 of FIG. 1, the memory 18 of FIG. 2 has a portion 38 dedicated to storing test patterns for testing the RF transmitter 24, the RF receiver 34 and the IF receiver and A/D converter 36. Although the controller 14 has been illustrated as containing a single memory 18 that stores both control commands as well as test patterns for testing the RF elements, a separate memory could be provided for storing such test patterns. In addition, a large mass storage device, such as a magnetic disk drive (not shown), could be substituted for the memory portion 38 to supply the test patterns via the I/O line 19.

The controller 14 of the test system 10' of FIG. 2 also differs from the controller 14 of FIG. 1 in another regard. As seen in FIG. 2, the controller 14 of the test system 10' includes a Boundary Scan Master circuit (BSM) 42, typically in the form of an AT&T model 497 AA Boundary-Scan Master circuit, available from AT&T Microelectronics, Allentown, Pa. The BSM 42 cooperates with the microprocessor 16 of the system 10' to carry out Boundary-Scan testing of the digital elements (not shown) within the controller 14 other than the microprocessor 16 and to carry out Boundary-Scan testing of the base-band processor 20. To that end, the base-band processor 20 is configured with a Boundary-Scan architecture as described in the publication entitled 1149.1 *Standard Test Access Port and Boundary-Scan Architecture* published by the IEEE, New York, N.Y. (herein incorporated by reference).

In addition to the BSM master 42, the controller 14 of FIG. 2 includes a bridge 44 coupled to the BSM via a bus 46. The bridge 44 functions to distribute Boundary-Scan test signals generated on the bus 46 by the BSM 42 to the digital elements in the controller 14 that are to be Boundary-Scan tested by the BSM. A bridge 48, identical to the bridge 44, is provided within the base-band processor 20 and serves to distribute Boundary-Scan test signals within the base-band processor that are supplied thereto via the bus 46. Both bridges 44 and 48 typically each comprise an Addressable Shadow Port (ASP) manufactured by Texas Instruments or a Scan Bridge device manufactured by National Semiconductor Corporation.

Referring to FIG. 2, to accomplish integrated testing of the RF elements (i.e., the RF transmitter 24, the RF receiver 34, and the IF receiver and A/D converter 36), the system 10' includes a coupler 49 for coupling the RF transmitter signal Tx to an attenuator 50. The attenuator 50 attenuates the signal received from the coupler 49 to yield a reduced strength signal for input to a down-converter 52. The down-converter 52 down-convarts the attenuated transmitter signal Tx to a lower frequency signal for input to an analog-to-digital (A/D) converter 54. The A/D converter 54 converts the analog signal produced by the down-converter 54 into a digital signal for input to the base-band processor 20.

The coupler 49 not only couples the RF transmitter signal Tx to the attenuator 50, but also couples the signal to a loop-back connection 56 that feeds the Tx signal to the RF receiver 34. In this way, the Tx signal produced by the RF transmitter 24 is supplied to the RF receiver 34 for demodulation. As described previously, the demodulated signal produced by the RF receiver 34 is input to the IF receiver and A/D converter 36 that converts the RF receiver 34 signal into a digital signal input to the base-band processor 20.

Overall testing of the digital/RF system 10' is carried out in the following manner. First, the digital elements within the controller 14 (other than the microprocessor 16) are structurally tested via Boundary-Scan testing, as is the, base-band processor 20. As described, such testing is carried out via the BSM 42. For a more complete description of Boundary-Scan testing, reference should be made to the aforementioned IEEE publication, herein incorporated by reference. In addition to accomplishing testing of the digital elements within the controller 14, the BSM 42 may facilitate Boundary-Scan testing of mixed signal elements within the system that are testable by the Boundary-Scan test technique.

Once structural testing of the digital portion of the system 10' has been carried out via the Boundary-Scan test technique, then the RF elements are tested. The RF transmitter 24 is tested via the base-band processor 20 by first downloading test patterns from the memory portion 38 to the base-band processor 20. The test patterns are then applied to the RF transmitter 26. In accordance with the down-loaded test patterns, the RF transmitter 24 produces the RF signal Tx. The RF signal Tx is attenuated by the attenuator 50 and then down-converted by the down-converter 52 before being digitized by the A/D converter 54. The digitized signal produced by the A/D converter 54 is then processed by the base-band processor 20 to determine the operability of the transmitter 24.

The RF receiver 34 is tested in a similar fashion. The RF signal Tx generated by the transmitter 24 in response to each applied test pattern is coupled to the RF receiver 34 via the loop-back connection 56. The Tx signal received by the RF receiver 34 is demodulated thereby to yield an IF signal that is down-convened and digitized by the IF receiver and A/D converter 36 to yield a base-band signal. This base-band signal is processed by the base-band processor 20 to determine the operability of the RF receiver 34 and IF receiver and A/D converter 36.

As may be appreciated, the digital/RF system 10' facilitates testing in an integrated manner since both the digital portion and the RF portion are tested via the controller 14 without the need for separate test equipment.

It is to be understood that the above-described embodiments are merely illustrative of the principles of the invention. Various modifications and changes may be made thereto by those skilled in the art which will embody the principles of the invention and fall within the spirit and scope thereof.

What is claimed is

1. A method for testing a digital RF system that includes a digital controller, a base-band processor, an RF transmitter and an RF receiver, the method comprising the steps of:

(a) testing the digital controller and the base-band processor by a digital structural test technique;

(b) down-loading at least one test pattern from the digital controller to the base-band processor;

(c) applying the test pattern to the RF transmitter to cause the transmitter to transmit at least one RF signal;

(d) converting the RF signal transmitted by the transmitter into a first digital signal stream for receipt by the base-band processor;

(e) processing the first digital signal stream at the base-band processor to verify the operation of the RF transmitter;

(f) receiving, at the receiver, the transmitted RF signal;

(g) convening the RF signal received by the receiver into a second digital signal stream; and (h) processing the second digital signal stream at the base-band processor to verify the operation of the receiver.

2. The method according to claim 1 wherein the digital controller and the base-band processor are tested by Boundary-Scan testing.

3. The method according to claim 1 wherein the RF signal transmitted by the transmitter is converted by the steps of:

attenuating the signal;

down-converting the signal; and digitizing the down-converted signal.

4. The method according to claim 1 wherein the step of receiving the transmitted RF signal includes the step of looping the RF signal from the RF transmitter to the RF receiver.

5. A digital RF system testable in a unified manner comprising:

an RF transmitter;

an RF receiver;

a base-band processor for processing forward signals for input to the transmitter and for processing a reverse signal received by the receiver; and a digital controller for controlling the operation of the transmitter and the base-band processor;

THE IMPROVEMENT COMPRISING:

testing means within the digital controller for effecting digital testing of the base-band processor;

storage means coupled to the controller for storing at least one test pattern for transmission to the base-band processor for down-loading to the transmitter;

conversion means coupled to the RF transmitter for converting an RF signal generated by the transmitter in response to a test pattern applied by the base-band processor to a first digital signal stream for processing by the digital controller; and means for coupling the RF transmitter to the RF receiver.

6. The apparatus according to claim 5 wherein the testing means comprises a Boundary-Scan Master for cooperating with the digital controller to effect Boundary-Scan testing of the base-band processor.

7. The apparatus according to claim 5 wherein the conversion means comprises:

an attenuator;

a down-converter; and an analog-to-digital converter.

8. The apparatus according to claim 5 wherein the coupling means comprises:

a loop-back connection coupled to the RF receiver; and a coupler for coupling the RF transmitter to the conversion means and to the loop-back connection.

* * * * *